United States Patent [19]
Cho et al.

[11] Patent Number: 5,707,901
[45] Date of Patent: Jan. 13, 1998

[54] METHOD UTILIZING AN ETCH STOP LAYER

[75] Inventors: Jaeshin Cho; Naresh Saha, both of Chandler, Ariz.

[73] Assignee: Motorola, Inc., Schaumburg, Ill.

[21] Appl. No.: 688,081

[22] Filed: Jul. 29, 1996

Related U.S. Application Data

[63] Continuation of Ser. No. 268,345, Jun. 29, 1994, abandoned.

[51] Int. Cl.$^6$ ................................................. H01L 21/28
[52] U.S. Cl. ........................... 438/595; 438/624; 438/637; 438/722; 438/740; 438/970
[58] Field of Search ........................ 437/190, 192, 437/195, 228, 236, 40, 41, 42, 184; 148/DIG. 113; 438/595, 624, 637, 722, 740, 970

[56] References Cited

U.S. PATENT DOCUMENTS

| | | | |
|---|---|---|---|
| 4,789,648 | 12/1988 | Chow et al. | 437/225 |
| 4,824,803 | 4/1989 | Us et al. | 437/194 |
| 4,855,247 | 8/1989 | Ma et al. | 437/41 |
| 4,861,732 | 8/1989 | Fujimura et al. | 437/229 |
| 4,944,836 | 7/1990 | Beyer et al. | 156/645 |
| 5,001,076 | 3/1991 | Mikkelson | 437/40 |
| 5,112,766 | 5/1992 | Fujii et al. | 437/41 |
| 5,118,382 | 6/1992 | Cronin et al. | 437/241 |
| 5,240,871 | 8/1993 | Doan et al. | 437/47 |
| 5,270,263 | 12/1993 | Kim et al. | 437/228 |
| 5,284,549 | 2/1994 | Barnes et al. | 156/662.1 |
| 5,381,046 | 1/1995 | Cederbaum et al. | 257/760 |
| 5,451,543 | 9/1995 | Woo et al. | 437/190 |

FOREIGN PATENT DOCUMENTS

| | | |
|---|---|---|
| 60-136267 | 7/1985 | Japan. |
| 62-272571 | 11/1987 | Japan. |
| 62-276832 | 12/1987 | Japan. |
| 01244666 | 9/1989 | Japan. |

OTHER PUBLICATIONS

S. Wolf, "Silicon Processing for the VLSI Era, vol. 1", Lattice Press, pp. 182–185, 191–194, 1986.
S. Wolf, "Silicon Processing for the VLSI Era, vol. 2", Lattice Press, 1986, pp. 555–556.
S. Wolf, "Silicon Processing for the VLSI Era, vol. 2", Lattice Press, 1990, pp. 124–125.
S. Subbanna et al., "A Novel Borderless Contact/Interconnect Technology Using Aluminum Oxide Etch Stop for High Performance SRAM and Logic", IEEE, 1993, pp. 441–444.
R.D.J. Verhaar et al., "A 25 μm2 Bulk Full CMOS SRAM Cell Technology with Fully Overlapping Contacts", IEEE, 1990, pp. 473–476.

*Primary Examiner*—John Niebling
*Assistant Examiner*—Thomas G. Bilodeau
*Attorney, Agent, or Firm*—Miriam Jackson; George C. Chen

[57] ABSTRACT

An etch stop layer prevents damage to the underlying semiconductor material or metallization layer during etching of a dielectric layer overlying the etch stop layer. The etch stop layer, aluminum nitride or aluminum oxide is used underlying silicon dioxide to prevent damage to the semiconductor material during a fluorocarbon based etch of the silicon dioxide. The etch stop layer is also used underlying a silicon dioxide layer and overlying a titanium nitride or titanium tungsten layer used in metallization to prevent etching of the titanium nitride or titanium tungsten layer during etching of the silicon dioxide.

17 Claims, 3 Drawing Sheets

METHOD UTILIZING AN ETCH STOP LAYER

This application is a continuation of prior application Ser. No. 08/268,345, filed Jun. 29, 1994, now abandoned.

BACKGROUND OF THE INVENTION

This invention relates, in general, to a semiconductor device, and more particularly, but not limited to, a semiconductor device and method of manufacture using an insulating layer comprised of aluminum.

A silicon dioxide layer is typically used overlying a semiconductor material. When forming small geometries, a reactive ion etch is used to remove portions of the silicon dioxide layer. As device geometries have shrunk, it has been difficult to maintain a uniform etch of the silicon dioxide layer across a wafer without etching of the underlying semiconductor material. This difficulty results in reactive-ion etch induced damage to the surface of the semiconductor material. This damage to the semiconductor material surface results in poor device yield, poor electrical characteristics and performance of the semiconductor device.

Another problem encountered with the use of a high power RIE to etch silicon dioxide is in forming metallization layers. Typically, a capping layer is formed over a metallization layer in order to improve reliability. However, during the formation of vias in a silicon dioxide layer overlying the capping layer, the capping layer was also etched by the high power RIE. Thus, the capping layer was removed from the desired location on the semiconductor device, resulting in the fabrication of devices having poor reliability.

Therefore, it would be desirable to have a manufacturable process which allows for the fabrication of semiconductor devices free of reactive ion etch induced damage and without etching of desirable layers which improve reliability.

DETAILED DESCRIPTION OF THE DRAWINGS

Figure 1:
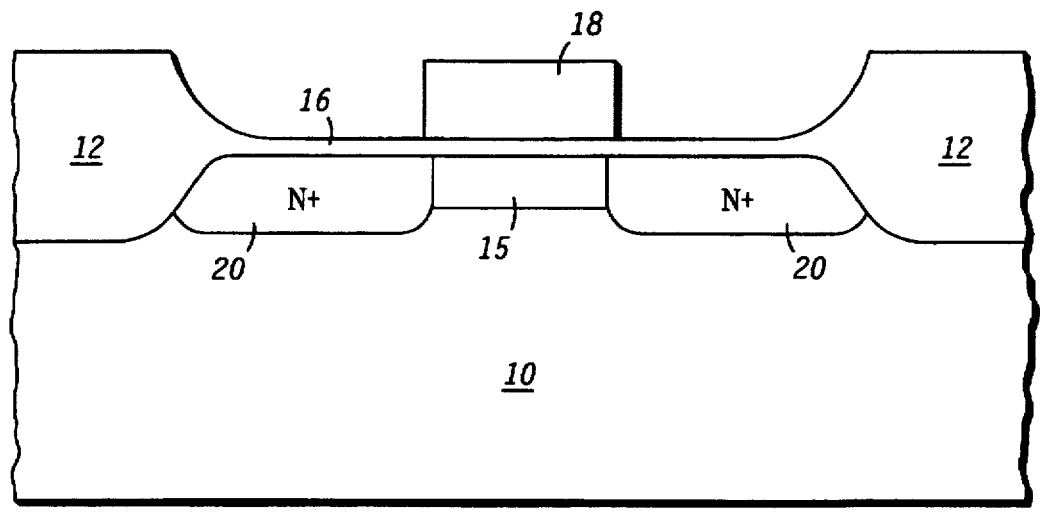
FIG. 1 illustrates an enlarged, cross-sectional view of an embodiment of the present invention in a beginning stage of fabrication.

FIG. 1 illustrates an enlarged, cross-sectional view of an embodiment of the present invention in a beginning stage of fabrication. A semiconductor material 10 is provided which is preferably comprised of silicon. The formation of a MOS device in semiconductor material 10 will be described, although, a number of the processing steps of the following invention can be utilized to fabricate bipolar devices. In general, the formation of MOS devices is well known in the art, and therefore, will only be briefly described.

First, a field oxide layer 12 is formed on semiconductor material 10. Thereafter, a channel region 15 is formed in the active area using the field oxide layer 12 as a mask. A gate dielectric layer 16 is formed on a portion of semiconductor material 10. Subsequently, a gate layer 18, typically comprised of polysilicon, is formed and patterned on gate dielectric 16. Source and drain regions 20 are formed utilizing gate layer 18 and field oxide layer 12 as masks.

Figure 2:
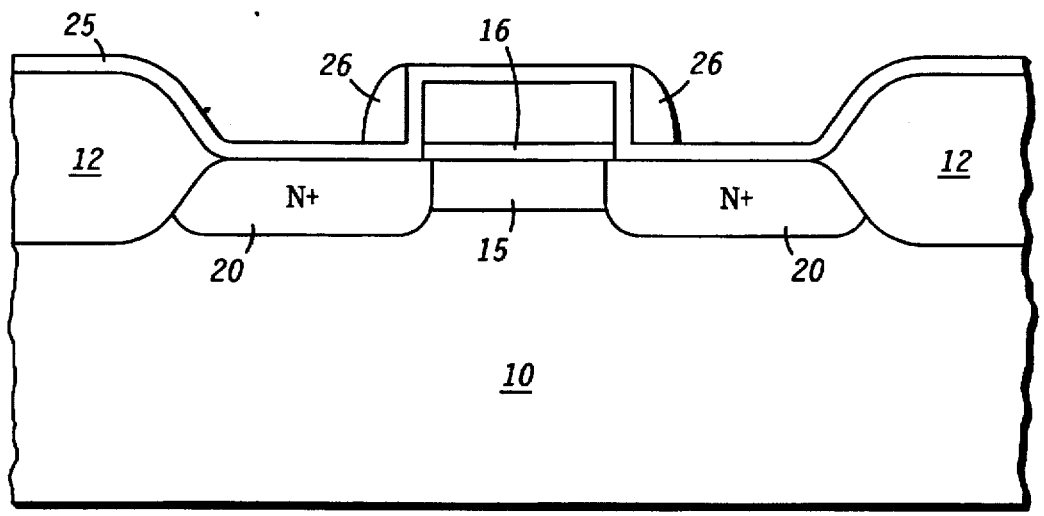
FIG. 2 illustrates an enlarged, cross-sectional view of an embodiment of the present invention in an intermediate stage of fabrication.

FIG. 2 illustrates the structure of FIG. 1 further along in processing. First, the exposed portions of gate dielectric layer 16 are removed. Then, a dielectric layer 25 comprised of aluminum is formed over the structure of FIG. 2. In this invention, a dielectric layer comprised of aluminum (as referred to above and hereinafter) is comprised of aluminum nitride or aluminum oxide. Dielectric layer 25 comprised of aluminum is preferably formed by reactive sputtering of aluminum using argon and nitrogen or oxygen gases. Other processes, such as metal-organic chemical vapor deposition may be used. In a preferred embodiment, dielectric layer 25 comprised of aluminum is of a thickness between 100 and 1000 Angstroms. The lower limit is constrained by the desire to avoid pin-hole formation associated with thinner layers where dielectric layer 25 would lose its etch stop property, while the upper limit is constrained by the loss of dimensional control due to undercutting during formation of spacer 26 (discussed below). Most preferably, the thickness of dielectric layer 25 ranges from about 300 to 500 angstroms in order to optimize both its etch stop property and ease of etching. Dielectric layer 25 acts as a sacrificial etch stop layer, as will be further described below.

Next, a dielectric layer comprised of silicon is formed over dielectric layer 25 comprised of aluminum, and an anisotropic etch is performed using a fluorocarbon plasma to etch the dielectric layer to form spacers 26 adjacent gate layer 18. Spacer 26 may be comprised of silicon dioxide or silicon nitride. Dielectric layer 25 comprised of aluminum acts as an etch stop to protect source and drain regions 20 from exposure to the fluorocarbon plasma. The thickness of the dielectric layer is determined by the desirable width of spacer 26.

Damage to source and drain regions 20 is prevented by utilizing dielectric layer 25 comprised of aluminum as an etch stop layer. Dielectric layer 25 comprised of aluminum is not substantially etched by a fluorocarbon based plasma etch. Without aluminum nitride layer 25, an overetch performed to form spacers 26 damaged the surface of semiconductor material 10 in source and drain regions 20. This damage resulted in poor electrical characteristics of the MOS device.

Figure 3:
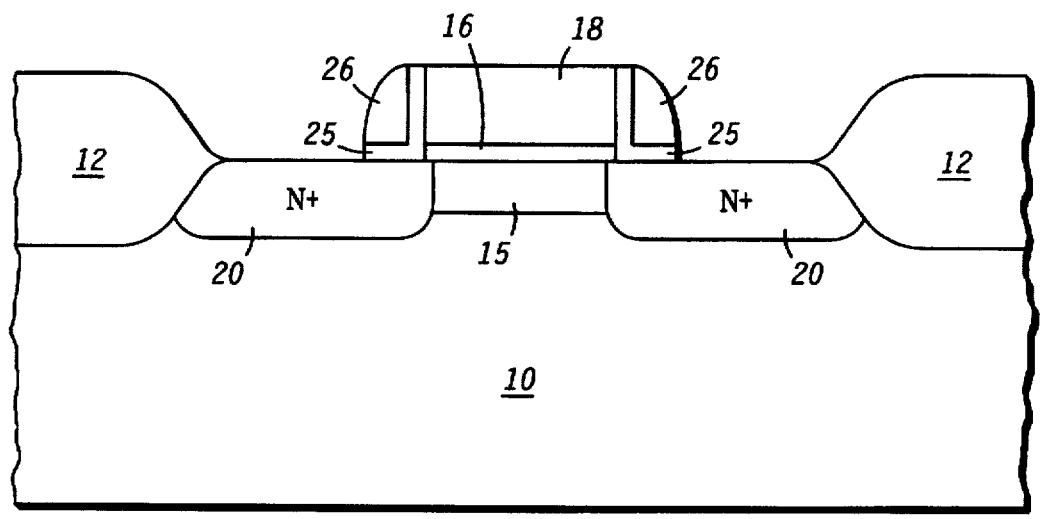
FIG. 3 illustrates an enlarged, cross-sectional view of an embodiment of the present invention in an intermediate stage of fabrication.

FIG. 3 illustrates the structure of FIG. 2 further along in processing. An ammonium hydroxide solution is used to remove the exposed portions of dielectric layer 25 composed of aluminum. A composite spacer comprised of dielectric layer 25 composed of aluminum and the dielectric layer of spacer 26 is thus formed adjacent to gate layer 18. Spacer 26 acts as a mask when exposed portions of aluminum nitride layer 25 are removed. The ammonium hydroxide solution does not damage the surface of semiconductor material in source and drain regions 20, thus a device may be formed with good electrical characteristics.

Figure 4:
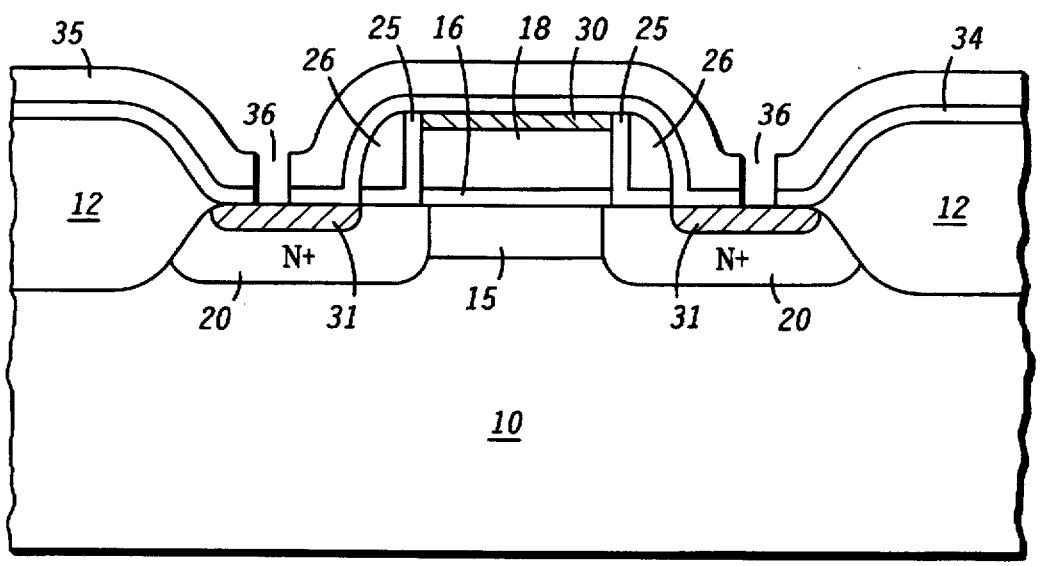
FIG. 4 illustrates an enlarged, cross-sectional view of an embodiment of the present invention in an intermediate stage of fabrication.

FIG. 4 illustrates the structure of FIG. 3 further along in processing. First, a silicide process is used to form silicide regions 30 over gate layer 18 and silicide regions 31 in source and drain regions 20. The silicide process is well known in the art. A dielectric layer 34 comprised of aluminum is formed on the surface of the structure of FIG. 4. Dielectric layer 34 comprised of aluminum is preferably formed as disclosed above with reference to dielectric layer 25 comprised of aluminum. Subsequently, a dielectric layer 35 is formed on the surface of dielectric layer 34 comprised of aluminum. Dielectric layer 35 is preferably comprised of doped silicon dioxide. A via 36 is formed in dielectric layer 35 and dielectric layer 34 comprised of aluminum by using the same etch processes as disclosed above to etch dielectric layer 25 comprised of aluminum to form spacer 26. Dielectric layer 34 comprised of aluminum also acts as an etch stop in this portion of the invention and prevents damage to underlying semiconductor material 10.

Figure 5:
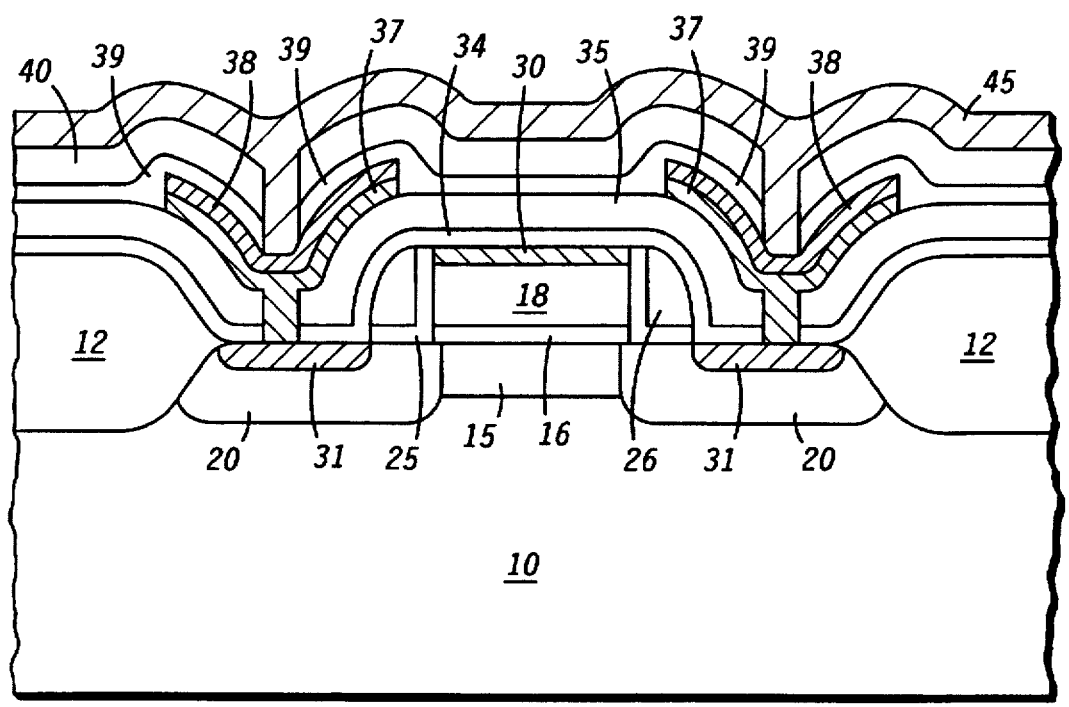
FIG. 5 illustrates an enlarged, cross-sectional view of an embodiment of the present invention in an final stage of fabrication.

FIG. 5 illustrates the structure of FIG. 4 further along in processing. A metal interconnect layer or metallization layer 37 is formed on dielectric layer 35 and in vias 36 to make contact with source and drain regions 20. Metallization layer 37 is typically comprised of a barrier metal layer (not separately shown) contacting the surface of semiconductor material 10 and a metal comprised of aluminum formed thereon. A capping layer 38 comprised of a metal is formed on metallization layer 37 to improve the reliability of metallization layer 37. Capping layer 38 is used to improve the electromigration resistance and prevent stress-induced void formation of a metal interconnect layer. In this embodiment, capping layer 38 is comprised of titanium tungsten or titanium nitride and has a thickness of approximately 125 Angstroms.

If multilevel metallization will be formed, a portion of metallization layer 37 and capping layer 38, may be removed using conventional etches so that only a portion of metallization layer 37 and capping layer 38 is left remaining over dielectric layer 35 and in vias 36 to form electrical contact to source and drain regions 20.

Thereafter, a dielectric layer 39 comprised of aluminum is then formed on the surface of capping layer 38 and dielectric layer 35. Dielectric layer 39 comprised of aluminum is preferably formed as disclosed above with reference to dielectric layer 25 comprised of aluminum. Subsequently, a dielectric layer 40 is formed and patterned to expose dielectric layer 39 comprised of aluminum and form vias 42. Dielectric layer 40 is preferably comprised of silicon dioxide or spin on glass. Dielectric layer 39 comprised of aluminum acts as an etch stop during the etch of dielectric layer 40.

Thereafter, dielectric layer 39 comprised of aluminum is removed by using an ammonium hydroxide etch as disclosed above. The ammonium hydroxide etch is selective to dielectric layer 39 comprised of aluminum and does not etch capping layer 38.

In the past, without the use of dielectric layer 39 comprised of aluminum, capping layer 38 was etched during the patterning of dielectric layer 40 to form vias 42 because capping layer 38 was thin and was etched at approximately the same rate as dielectric layer 40. Because an overetch of dielectric layer 40 is required, capping layer 38 was often totally etched at the same time.

Thus, even though capping layer 38 was formed to improve reliability, this objective was not being achieved in the past. Use of dielectric layer 39 comprised of aluminum thus prevents the removal of capping layer 38 and results in devices which are manufactured with high reliability. A second metallization layer 45 is formed on the surface of dielectric layer 40 and makes contact to capping layer 38 through vias 42.

As can be readily seen, a device utilizing aluminum nitride during various processing steps enables a device to be manufactured without damage to source and drain regions and without removal of reliability enhancing layers. In particular, the removal of a titanium tungsten or titanium nitride layer capping a metal interconnect layer during the etch of an overlying dielectric layer is prevented by using an aluminum nitride layer as an etch stop. It is also important to note that throughout the process, the dielectric layers comprised of aluminum are used as sacrificial etch stop layers; the portion of the dielectric layer comprised of aluminum which must be removed, is removed prior to exposure of the structure to a high temperature step. If a high temperature step is performed after the dielectric layer comprised of aluminum is exposed to a fluorocarbon based etchant, but before its removal, it has been discovered that it becomes impossible to remove using any known, conventional etchants.

We claim:

1. A method of forming a semiconductor structure, comprising the steps of:

providing a semiconductor material;

forming a first metallization layer over the semiconductor material;

forming a layer comprised of titanium over the first metallization layer;

forming a dielectric layer comprised of aluminum nitride over the layer comprised of titanium;

forming a dielectric layer comprised of silicon over the dielectric layer comprised of aluminum nitride;

removing a portion of the dielectric layer comprised of silicon over the layer comprised of titanium;

removing a portion of the dielectric layer comprised of aluminum nitride over the layer comprised of titanium; and forming a second metallization layer over the layer comprised of titanium.

2. The method of claim 1 wherein the step of forming the layer comprised of titanium comprises forming the layer comprised of titanium to be comprised of titanium nitride.

3. The method of claim 1 wherein the step of forming the layer comprised of titanium comprises forming the layer comprised of titanium to be comprised of titanium tungsten.

4. The method of claim 1 wherein the step of forming the dielectric layer comprised of silicon comprises forming the dielectric layer comprised of silicon to be comprised of silicon dioxide.

5. The method of claim 1 wherein the step of removing the portion of the dielectric layer comprised of silicon comprises removing the portion of the dielectric layer comprised of silicon with a fluorocarbon based dry etchant.

6. The method of claim 1 wherein the step of removing the portion of the dielectric layer comprised of silicon comprises removing the portion of the dielectric layer comprised of silicon with a fluorocarbon based dry etchant, wherein the dielectric layer comprised of aluminum nitride acts as an etch stop layer.

7. The method of claim 1 wherein the step of removing the portion of the dielectric layer comprised of aluminum nitride comprises removing the portion of the dielectric layer comprised of aluminum nitride with an ammonium hydroxide etchant.

8. The method of claim 1 further comprising the steps of:

forming a gate layer over a portion of the semiconductor material;

forming a channel region in a portion of the semiconductor material underlying the gate layer;

forming a source region and a drain region in a portion of the semiconductor material adjacent the channel region; and forming a spacer adjacent the gate layer over a portion of the semiconductor material, wherein the spacer is comprised of a dielectric layer comprised of aluminum and a dielectric layer comprised of silicon, and wherein the first metallization layer makes electrical contact to the source region and the drain region.

9. A method of forming a semiconductor structure, comprising the steps of:

providing a semiconductor material;

forming a gate layer over a portion of the semiconductor material;

forming a channel region in a portion of the semiconductor material underlying the gate layer;

forming a source region and a drain region in a portion of the semiconductor material adjacent the channel region;

forming a first dielectric layer comprised of aluminum over the semiconductor material and the gate layer;

forming a first dielectric layer comprised of silicon over the first dielectric layer comprised of aluminum; and forming a spacer adjacent to the gate layer by removing a portion of the first dielectric layer comprised of silicon and by removing a portion of the first dielectric layer comprised of aluminum while using the first dielectric layer comprised of silicon as a mask.

10. The method of claim 9 wherein the step of forming the first dielectric layer comprised of aluminum comprises forming the first dielectric layer comprised of aluminum to be comprised of aluminum nitride.

11. The method of claim 9 further comprising the steps of:

forming a first metallization layer over the source region and the drain region;

forming a layer comprised of titanium over the first metallization layer;

forming a second dielectric layer comprised of aluminum over the layer comprised of titanium;

forming a second dielectric layer comprised of silicon over the second dielectric layer comprised of aluminum;

removing a portion of the second dielectric layer comprised of silicon;

removing a portion of the second dielectric layer comprised of aluminum; and forming a second metallization layer over the layer comprised of titanium.

12. The method of claim 11 wherein the step of forming the layer comprised of titanium comprises forming the layer comprised of titanium to be comprised of titanium nitride.

13. The method of claim 11 wherein the step of forming the layer comprised of titanium comprises forming the layer comprised of titanium to be comprised of titanium tungsten.

14. The method of claim 9 wherein the step of removing the portion of the first dielectric layer comprised of silicon comprises removing the portion of the first dielectric layer comprised of silicon with a fluorocarbon based dry etchant.

15. The method of claim 9 wherein the step of removing the portion of the first dielectric layer comprised of aluminum comprises removing the portion of the first dielectric layer comprised of aluminum with an ammonium hydroxide etchant.

16. A method of forming a semiconductor structure, comprising the steps of:

providing a semiconductor material;

forming a gate layer over a portion of the semiconductor material;

forming a channel region in a portion of the semiconductor material underlying the gate layer;

forming a source region and a drain region in a portion of the semiconductor material adjacent the channel region;

forming a spacer adjacent the gate layer over a portion of the semiconductor material, wherein the spacer is comprised of a first dielectric layer comprised of aluminum and a first silicon dioxide layer;

forming a second dielectric layer comprised of aluminum over a portion of the semiconductor material over the source region and the drain region and over the spacer and the gate layer;

forming a second silicon dioxide layer over the second dielectric layer comprised of aluminum;

removing a portion of the second silicon dioxide layer over a portion of the source region and a portion of the drain region;

removing a portion of the second dielectric layer comprised of aluminum over a portion of the source region and a portion of the drain region;

forming a first metallization layer to make electrical contact with the source region and the drain region;

forming a layer comprised of titanium over the first metallization layer;

forming a third dielectric layer comprised of aluminum over the layer comprised of titanium;

forming a third silicon dioxide layer over the third dielectric layer comprised of aluminum;

removing a portion of the third silicon dioxide layer over the layer comprised of titanium, using the third dielectric layer comprised of aluminum as an etch stop;

removing a portion of the third dielectric layer comprised of aluminum over the layer comprised of titanium; and forming a second metallization layer over the layer comprised of titanium.

17. A method of forming a semiconductor structure, the method comprising the steps of:

providing a semiconductor material;

providing a dielectric layer comprised of aluminum overlying the semiconductor material;

removing a portion of the dielectric layer comprised of aluminum after the step of providing the dielectric layer comprised of aluminum and prior to exposing the dielectric layer to an anneal;

exposing the dielectric layer to an anneal after the step of removing the portion of the dielectric layer; and exposing the dielectric layer comprised of aluminum to a fluorocarbon based etchant after providing the dielectric layer comprised of aluminum and before removing the portion of the dielectric layer comprised of aluminum.

* * * * *